United States Patent
Barkley et al.

(10) Patent No.: US 10,224,810 B2
(45) Date of Patent: Mar. 5, 2019

(54) HIGH SPEED, EFFICIENT SIC POWER MODULE

(71) Applicant: Cree, Inc., Durham, NC (US)

(72) Inventors: Adam Barkley, Raleigh, NC (US); Marcelo Schupbach, Raleigh, NC (US)

(73) Assignee: Cree, Inc., Durham, NC (US)

( * ) Notice: Subject to any disclaimer, the term of this patent is extended or adjusted under 35 U.S.C. 154(b) by 300 days.

(21) Appl. No.: 15/295,599

(22) Filed: Oct. 17, 2016

(65) Prior Publication Data

US 2017/0040890 A1    Feb. 9, 2017

Related U.S. Application Data

(63) Continuation-in-part of application No. 15/055,872, filed on Feb. 29, 2016.
(Continued)

(51) Int. Cl.
*H01L 29/16* (2006.01)
*H02M 3/155* (2006.01)
(Continued)

(52) U.S. Cl.
CPC .......... *H02M 3/155* (2013.01); *C04B 37/026* (2013.01); *H01L 23/3735* (2013.01); *H01L 24/48* (2013.01); *H01L 25/072* (2013.01); *H01L 25/18* (2013.01); *H01L 29/1608* (2013.01); *H01L 29/7801* (2013.01); *H01L 29/872* (2013.01); *H02M 1/08* (2013.01); *H02M 1/44* (2013.01); *H02M 7/003* (2013.01);
(Continued)

(58) Field of Classification Search
None
See application file for complete search history.

(56) References Cited

U.S. PATENT DOCUMENTS

2004/0212074 A1    10/2004  Divakar et al.
2009/0283309 A1*   11/2009  Naba .................. B23K 35/30
                                                     174/258
(Continued)

FOREIGN PATENT DOCUMENTS

WO    2013171136 A1    11/2013
WO    2014186448 A1    11/2014

OTHER PUBLICATIONS

International Preliminary Report on Patentability for International Patent Application No. PCT/US2016/022031, dated Sep. 28, 2017, 10 pages.
(Continued)

*Primary Examiner* — Michael Lebentritt
*Assistant Examiner* — Jordan M Klein
(74) *Attorney, Agent, or Firm* — Anthony J. Josephson

(57) ABSTRACT

A power converter module includes a baseplate, a substrate on the baseplate, one or more silicon carbide switching components on the substrate, and a housing over the baseplate, the substrate, and the one or more silicon carbide switching components. The housing has a footprint less than 25 cm². Including a baseplate in a power converter module with a footprint less than 25 cm² runs counter to accepted design principles for silicon and silicon carbide-based power converter modules, but may improve performance of the power converter module and/or decrease the cost of the power converter module.

21 Claims, 13 Drawing Sheets

Related U.S. Application Data

(60) Provisional application No. 62/133,872, filed on Mar. 16, 2015.

(51) Int. Cl.

| | | |
|---|---|---|
| *H02M 1/08* | (2006.01) | |
| *H02M 7/00* | (2006.01) | |
| *H05K 5/02* | (2006.01) | |
| *H01L 29/78* | (2006.01) | |
| *H01L 29/872* | (2006.01) | |
| *H01L 25/18* | (2006.01) | |
| *H01L 23/00* | (2006.01) | |
| *H01L 23/373* | (2006.01) | |
| *H01L 25/07* | (2006.01) | |
| *H02M 1/44* | (2007.01) | |
| *C04B 37/02* | (2006.01) | |
| *H02M 1/00* | (2006.01) | |
| *H02M 1/34* | (2007.01) | |

(52) U.S. Cl.
CPC ........ *H05K 5/0256* (2013.01); *B60L 2210/00* (2013.01); *C04B 2237/366* (2013.01); *C04B 2237/368* (2013.01); *H01L 2224/45015* (2013.01); *H01L 2224/48157* (2013.01); *H01L 2224/4903* (2013.01); *H01L 2224/49111* (2013.01); *H01L 2224/49431* (2013.01); *H01L 2924/00014* (2013.01); *H02M 2001/0054* (2013.01); *H02M 2001/348* (2013.01); *Y02B 70/1483* (2013.01)

(56) References Cited

U.S. PATENT DOCUMENTS

| | | | |
|---|---|---|---|
| 2011/0169549 A1* | 7/2011 | Wu | H02M 7/003 327/434 |
| 2011/0210708 A1* | 9/2011 | Herbsommer | H01L 23/49524 323/271 |
| 2013/0020672 A1* | 1/2013 | Tipton | H01L 23/3735 257/496 |
| 2013/0207123 A1* | 8/2013 | Henning | H01L 29/7806 257/77 |
| 2013/0248883 A1* | 9/2013 | Das | H01L 24/49 257/77 |
| 2014/0070627 A1 | 3/2014 | Briere et al. | |
| 2014/0138707 A1* | 5/2014 | Miki | H01L 25/18 257/77 |
| 2014/0246681 A1* | 9/2014 | Das | H01L 27/0629 257/77 |
| 2015/0130071 A1 | 5/2015 | Hohlfeld et al. | |
| 2015/0131236 A1* | 5/2015 | Passmore | H05K 7/02 361/728 |
| 2016/0276927 A1 | 9/2016 | Das et al. | |
| 2017/0213811 A1 | 7/2017 | Das et al. | |

OTHER PUBLICATIONS

Invitation to Pay Additional Fees and Partial International Search for International Patent Application No. PCT/US2016/022031, dated Jun. 22, 2016, 6 pages.

International Search Report and Written Opinion for International Patent Application No. PCT/US2016/022031, dated Aug. 16, 2016, 15 pages.

Non-Final Office Action for U.S. Appl. No. 15/055,872, dated Mar. 26, 2018, 17 pages.

Final Office Action for U.S. Appl. No. 15/055,872, dated Oct. 2, 2018, 17 pages.

\* cited by examiner

HIGH SPEED, EFFICIENT SIC POWER MODULE

RELATED APPLICATIONS

This application is a continuation in part of U.S. patent application Ser. No. 15/055,872, filed Feb. 29, 2016, which claims the benefit of provisional patent application No. 62/133,872, filed Mar. 16, 2015, the disclosures of which are incorporated herein by reference in their entirety.

FIELD OF THE DISCLOSURE

The present disclosure relates to power converter modules, and specifically to small footprint, high-frequency power converter modules utilizing silicon carbide (SiC) components.

BACKGROUND

Power converter modules (which, as referred to herein may also include power inverter modules) are standalone devices that may perform a variety of functions within a power converter system. For example, power converter modules may include boost converters, buck converters, half-bridge converters, and full-bridge converters. Conventional power converter modules generally include power converter circuitry utilizing silicon switching components. While effective in many applications, using power converter circuitry with silicon switching components generally limits the switching frequency at which the power converter circuitry can operate. The lower the switching frequency of the components in the power converter circuitry, the larger the filtering components such as inductors and capacitors utilized in a power converter system need to be. Accordingly, filtering components used along with power converter circuitry using silicon switching components must be quite large, thereby driving up the cost of the power converter system. Further, at high switching frequency, silicon switching components are often associated with relatively low efficiency and low power density.

Conventional design principles for silicon-based power converter modules focus on ways to reduce the size and/or cost of or remove additional components of the module. This is because the cost associated with silicon switching components in a conventional power converter module is negligible when compared to additional components of the module such as thermal management components (e.g., baseplates, substrates, etc.). In many cases, following this design approach necessitates increasing the size of the silicon switching components used in the module in order to compensate for the alteration of the additional components. For example, conventional small footprint power converter modules (e.g., those with a footprint of approximately 31 mm×66 mm×16 mm) do not include a baseplate to save cost. These small footprint power converter modules have thus become well known in the industry as "baseplate-less" power converter modules. Additionally, these conventional small footprint power converter modules may opt for cheaper materials in the construction of a power substrate therein, which may have reduced thermal performance when compared to more expensive materials. To compensate for any loss in thermal performance due to the alteration of additional components in a conventional power converter module described above, the size of the silicon switching components in the module may be increased. By increasing the size of the silicon switching components, the heat generated by these components is spread out over a larger area, such that the components do not require additional thermal management. Since the additional components in conventional power converter modules are often significantly more expensive than the silicon added by increasing the size of the switching components, such a trade-off results in an overall reduction in cost of the module.

SUMMARY

The present disclosure relates to power converter modules, and specifically to small-footprint, high-frequency power converter modules utilizing silicon carbide (SiC) components. In one embodiment, a power converter module includes a baseplate, a substrate on the baseplate, one or more silicon carbide switching components on the substrate, and a housing over the baseplate, the substrate, and the one or more silicon carbide switching components. The housing has a footprint less than 25 cm$^2$. Including a baseplate in a power converter module with a footprint less than 25 cm$^2$ runs counter to accepted design principles for silicon and silicon carbide-based power converter modules, but significantly improves the thermal performance of the module. Such an improvement in thermal performance allows for a reduction in size of the one or more silicon carbide switching components while maintaining the same power rating and/or increasing the power rating of the power converter module without increasing the size of the silicon carbide switching components. Reducing the size of the silicon carbide switching components in turn reduces the overall cost of the power converter module, whereas increasing the power rating of the power converter module without changing the size of the silicon carbide switching components reduces the cost performance (e.g., dollars per Amp) of the power converter module.

In one embodiment, a power converter module includes a baseplate, a substrate on the baseplate, one or more silicon carbide switching components on the substrate, and a housing over the baseplate, the substrate, and the one or more silicon carbide switching components. The one or more silicon carbide switching components occupy an active area less than 30 mm$^2$ per switching component. Including a baseplate in a power converter module wherein an active area of the silicon carbide switching components therein is less than 30 mm$^2$ per switching component runs counter to accepted design principles for silicon and silicon carbide-based power converter modules, but significantly improves the thermal performance of the module. Such an improvement in thermal performance allows for a reduction in size of the one or more silicon carbide switching components while maintaining the same power rating and/or increasing the power rating of the power converter module without increasing the size of the silicon carbide switching components. Reducing the size of the silicon carbide switching components in turn reduces the overall cost of the power converter module, whereas increasing the power rating of the power converter module without changing the size of the silicon carbide switching components reduces the cost performance (e.g., dollars per Amp) of the power converter module.

In one embodiment, a power converter module includes a substrate, one or more silicon carbide switching components, and a housing. The substrate includes a base layer, a first conductive layer on a first surface of the base layer, and a second conductive layer on a second surface of the base layer opposite the first surface. The first conductive layer has a thickness greater than 1.5 mm. The one or more silicon carbide switching components are on the first conductive layer of the substrate. The housing is over the substrate and the one or more silicon carbide switching components. By providing the first conductive layer with a thickness greater than 1.5 mm, the thermal performance of this layer is significantly improved, which may allow for a reduction in size of the one or more silicon carbide switching components while maintaining the same power rating and/or increasing the power rating of the power converter module without changing the size of the one or more silicon carbide switching components. Reducing the size of the silicon carbide switching components in turn reduces the overall cost of the power converter module, whereas increasing the power rating of the power converter module without changing the size of the silicon carbide switching components reduces the cost performance (e.g., dollars per Amp) of the power converter module.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
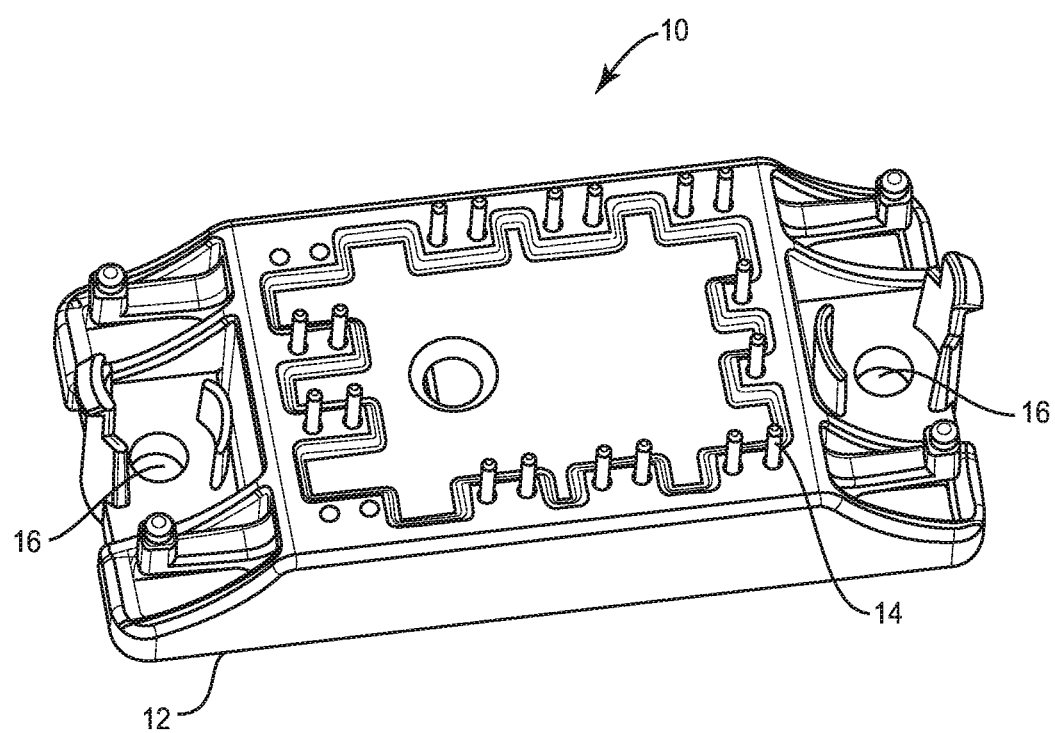
FIG. 1 is an isometric view of a power converter module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to power converter modules including silicon carbide switching components. Conventional design principles used for silicon-based power converter modules such as those discussed above are not always applicable to cost-effective silicon carbide-based power converter modules. This is due at least in part to the fact that silicon carbide is significantly more expensive than silicon. Accordingly, the conventional design principles for silicon-based power converter modules have been modified for silicon carbide-based power converter modules. The resulting state of the art design principles for silicon carbide-based power converter modules, which are well known in the industry, focus on reducing the size of, reducing the cost of, and/or removing additional components (e.g., thermal management components) and simultaneously minimizing the size of the silicon carbide switching components in the module. Generally, there is a point at which the silicon carbide switching components cannot be made any smaller while maintaining a particular power rating due to the thermal performance thereof. According to state of the art design principles for silicon carbide-based power converter modules, such a point is calculated and the silicon carbide switching components in the module are sized appropriately.

The inventors of the subject matter described in the present disclosure discovered that the conventional design principles for silicon-based power converter modules and the state of the art design principles for silicon carbide-based power converter modules often provide sub-optimal results. In particular, the inventors discovered that by adding additional components to a power converter module or using more expensive additional components with advantageous performance characteristics often allows one or more silicon carbide switching components in a power converter module to be made smaller while maintaining the same power rating as a similar power converter module wherein the additional components have been minimized according to the previously accepted design principles. Since the cost of silicon carbide is often significantly more expensive than the cost of improving or adding additional components, creating a power converter module according to these updated design principles often results in cheaper higher performing power converter modules. These updated design principles for silicon carbide-based power converter modules, which run counter to the conventional design principles for silicon-based power converter modules and the state of the art design principles for silicon carbide-based power converter modules, often result in an optimal tradeoff between performance and cost.

A first application of the updated design principles discussed above is discussed in detail below, and involves using an active metal braze (AMB) substrate in a silicon carbide-based power converter module. In particular, an AMB substrate with an aluminum nitride base layer is used. Generally, aluminum nitride would not be used for such a substrate due to the high cost of aluminum nitride when compared, for example, to aluminum oxide. However, aluminum nitride provides significantly improved thermal performance over aluminum oxide, and thus may allow the size of one or more silicon carbide switching components in the power converter module to be reduced while maintaining the same power rating, or may allow the power rating of the power converter module to be significantly increased while maintaining the size of the silicon carbide switching components. The reduction in size of the one or more silicon carbide switching components and/or the increase in power rating of the power converter module may more than account for the additional cost of the AMB substrate with the aluminum nitride base layer, resulting in a cheaper and better performing silicon carbide power converter module.

A second application of the updated design principles discussed above is discussed in detail below, and involves providing a baseplate to a power converter module that usually does not include a baseplate due to the conventional design principles for silicon-based power converter modules and the state of the art design principles for silicon carbide-based power converter modules discussed above. A baseplate generally accounts for a significant portion of the cost of a silicon-based power converter module. Accordingly, conventional design principles for silicon-based power converter modules would omit the baseplate whenever possible. As discussed above, these design principles carried over into silicon carbide-based power converter modules wherein the state of the art design principles focused on minimizing both additional components and the size of the silicon carbide switching components. Running counter to these previously accepted design principles, the inventors discovered that adding a baseplate to a silicon carbide-based power converter module may significantly increase the thermal performance thereof, allowing a 40% decrease in size of the silicon carbide switching components therein while maintaining the same power rating, or allowing for a 40% increase in the power rating of the power converter module without changing the size of the silicon carbide switching components. The reduction in size of the one or more silicon carbide switching components and/or the increase in power rating of the power converter module may more than account for the additional cost of the baseplate, thereby resulting in a cheaper and better performing power converter module. Using both the AMB substrate with an aluminum nitride base layer and providing a baseplate may further increase the performance of and/or lower the cost of a power converter module.

Figure 2:
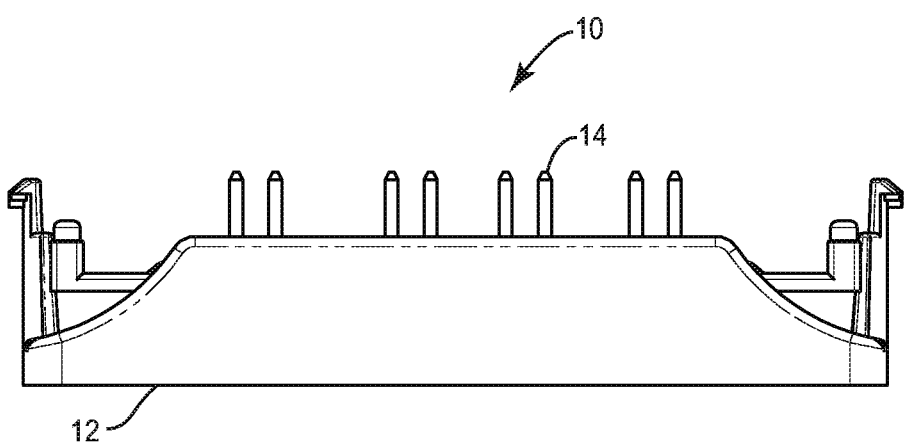
FIG. 2 is a side view of a power converter module according to one embodiment of the present disclosure.

FIGS. 1 and 2 show an isometric view and a side view, respectively, of a power converter module 10 according to one embodiment of the present disclosure. The power converter module 10 includes a housing 12, a number of input/output (I/O) pins 14, and a number of mounting holes 16. The housing 12 may be formed of a plastic material and have a footprint of approximately 31 mm×66 mm×16 mm such that the power converter module 10 is compatible with existing power converter systems that accept power converter modules of this size. In an additional embodiment, the housing 12 may have a footprint of approximately 5 cm×4 cm×2 cm. Notably, the principles of the present disclosure may be applied to housings of any material type and size. The I/O pins 14 are coupled to various points in power converter circuitry (not shown) contained within the housing 12, as discussed in detail below.

Figure 3:
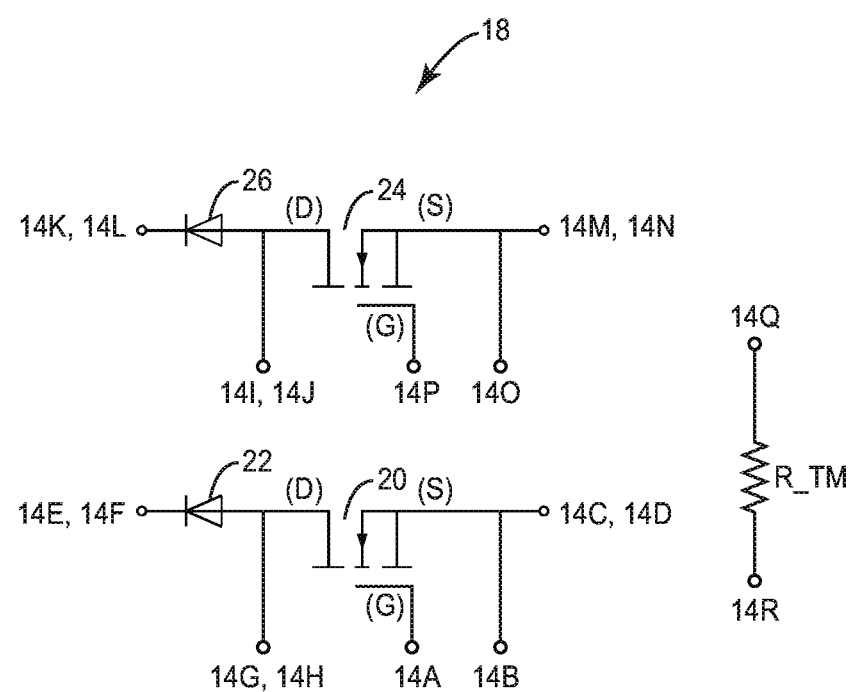
FIG. 3 is a schematic of power converter circuitry in a power converter module according to one embodiment of the present disclosure.

FIG. 3 is a schematic showing details of power converter circuitry 18 within the housing 12 of the power converter module 10 according to one embodiment of the present disclosure. The power converter circuitry 18 is divided into two parts (referred to herein as "channels"), and includes a first metal-oxide-semiconductor field-effect transistor (MOSFET) 20 coupled in series with a first diode 22 and a second MOSFET 24 coupled in series with a second diode 26. Specifically, the first MOSFET 20 includes a gate contact (G), a source contact (S), and a drain contact (D). The gate contact (G) of the first MOSFET 20 is coupled to a first one of the I/O pins 14A. The source contact (S) of the first MOSFET 20 is coupled to a second, a third, and a fourth one of the I/O pins 14B, 14C, and 14D. A cathode of the first diode 22 is coupled to a fifth and a sixth one of the I/O pins 14E and 14F. The drain contact (D) of the first MOSFET 20 is coupled to a ninth and a tenth one of the I/O pins 14G and 14H and to the anode of the first diode 22.

Similarly, the second MOSFET 24 includes a gate contact (G), a source contact (S), and a drain contact (D). The drain contact (D) of the second MOSFET 24 is coupled to an eleventh and a twelfth one of the I/O pins 14I and 14J and to the anode of the second diode 26. The cathode of the second diode 26 is coupled to a thirteenth and a fourteenth one of the I/O pins 14K and 14L. The source contact (S) of the second MOSFET 24 is coupled to a fifteenth, a sixteenth, and a seventeenth one of the I/O pins 14M, 14N, 14O. The gate contact (G) of the second MOSFET 24 is coupled to an eighteenth one of the I/O pins 14P. A temperature measurement resistor R_TM is coupled between a nineteenth and a twentieth one of the I/O pins 14Q and 14R.

The first MOSFET 20 and the first diode 22 (i.e., a first channel), along with one or more external components, form first boost converter circuitry, while the second MOSFET 24 and the second diode 26 (i.e., a second channel), along with one or more external components, form second boost converter circuitry. Because the separate boost converter circuitry operates in the same manner, the principles of operation thereof will now be discussed as they relate to the first boost converter circuitry. In operation, a direct current (DC) voltage is placed across the source contact (S) and the drain contact (D) of the first MOSFET 20. In some embodiments, the DC voltage delivered to the drain contact (D) of the first MOSFET 20 may be provided via a boost inductor (not shown). Further, a switching control signal is provided to the gate contact (G) of the first MOSFET 20, generally by gate driver circuitry (not shown). The resulting voltage across the cathode of the first diode 22 and the source contact (S) of the first MOSFET 20 is a stepped-up DC output voltage. Accordingly, the first boost converter scale high-power DC voltages, which may be especially useful in applications such as solar power systems.

Notably, the first MOSFET 20 and the second MOSFET 24 each include a gate return terminal (I/O pin 14B and I/O pin 14O, respectively) coupled to the source contact (S) thereof. Notably, these gate return terminals are located as close to the first MOSFET 20 and the second MOSFET 24, respectively, as possible, such that a parasitic inductance between the gate return terminal and the source contact (S) is minimized. Generally, this increases the achievable turn-on and turn-off speed of the first MOSFET 20 and the second MOSFET 24, thereby improving the performance of the power converter circuitry 18 by reducing switching losses.

Any of the first MOSFET 20, the first diode 22, the second MOSFET 24, and the second diode 26 are silicon carbide devices, which may be referred to as switching devices. As discussed herein, switching devices are devices capable of selectively delivering power to a load. In one embodiment, the first diode 22 and the second diode 26 are Schottky diodes. Accordingly, the performance of the power converter module 10 may be significantly improved. Specifically, because silicon carbide devices are majority carrier devices, they do not suffer from reductions in switching speed due to recombination of minority carriers that produce tail or reverse recovery currents. In one embodiment, recovery currents in conventional silicon PiN diodes are on the order of ~7000 nC, while recovery currents in the power converter circuitry 18 are less than ~120 nC (>16× reduction). Accordingly, silicon carbide devices can be operated at much higher speeds than conventional silicon devices, which provides several performance benefits for the power converter module 10 discussed below. The first boost converter circuit and the second boost converter circuit may be referred to as "channels." Each one of these channels may provide an output voltage between 650V and 1200V, an output current from 10 A to 50 A (e.g., 10 A, 20 A, 30 A, 40 A, and 50 A), and an output power between 900 W and 30 kW. Further, each one of these channels may provide an efficiency between about 96% and 99.5%, and switching losses less than or equal to about 300 W when operated at switching speeds greater than 40 kHz.

In addition to the performance benefits afforded by utilizing silicon carbide devices in the power converter module 10, using silicon carbide devices also provides cost savings. Specifically, the size of filtering components such as inductors and capacitors used in a power converter system in which the power converter module 10 is incorporated is inversely proportional to the switching frequency of the power converter module. Further, the size of filtering components is proportional to the cost thereof. Accordingly, by using silicon carbide switching components that may be operated at high frequencies such as those above 40 kHz, the size of filtering components in a power system can be drastically reduced, thereby saving cost.

While the power converter circuitry 18 shown in FIG. 3 is shown as a two-channel boost converter, the present disclosure is not so limited. The principles of the present disclosure may be applied to power converter circuitry 18 including a buck converter, a half-bridge converter, a full-bridge converter, a single-phase inverter, a three-phase inverter, or the like.

Figure 4:
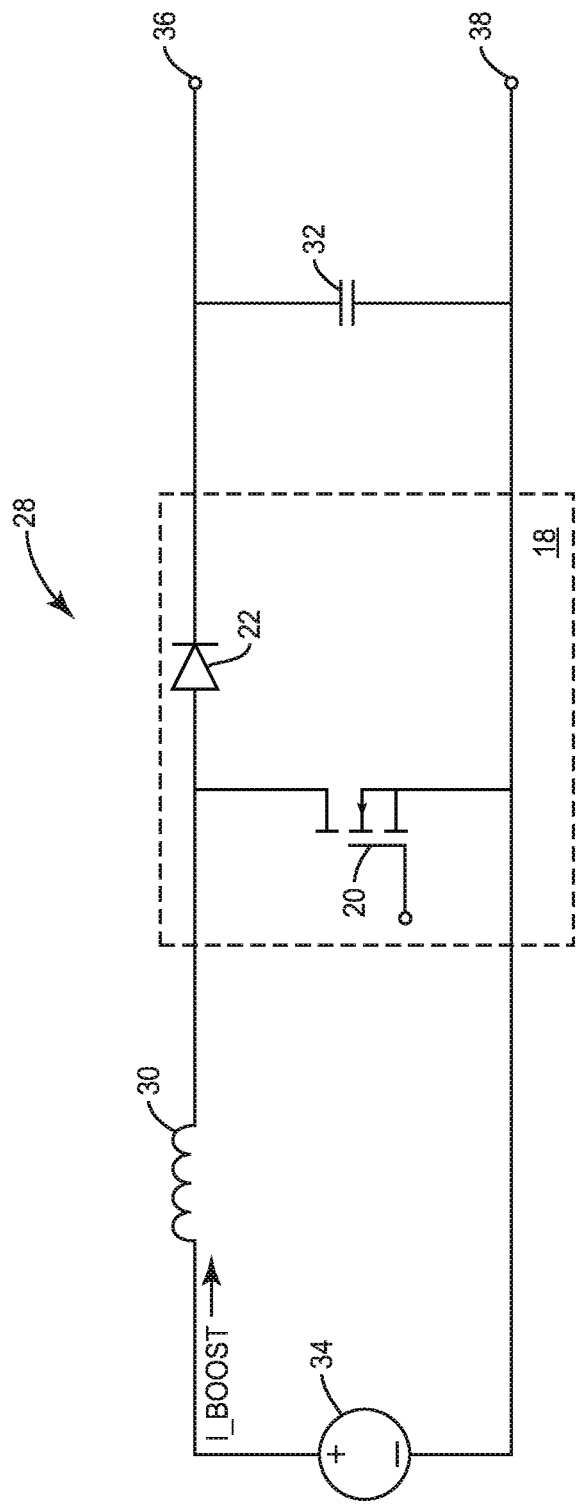
FIG. 4 is a schematic of a boost converter including power converter circuitry shown according to one embodiment of the present disclosure.

FIG. 4 shows boost converter circuitry 28 including a first channel of the power converter circuitry 18. The boost converter circuitry 28 includes the first MOSFET 20 and the first diode 22, a boost inductor 30, an output capacitor 32, and a voltage source 34. The boost inductor 30 is coupled between a positive output of the voltage source 34 and the drain contact (D) of the first MOSFET 20. A negative output of the voltage source 34 is coupled to the source contact (S) of the first MOSFET 20. The first diode 22 is coupled between the drain contact (D) of the first MOSFET 20 and a first load output 36 of the boost converter circuitry 28. A second load output 38 is coupled to the source contact (S) of the first MOSFET 20. The output capacitor 32 is coupled between the first load output 36 and the second load output 38.

In operation, a positive voltage from the voltage source 34 is delivered to the boost inductor 30, where energy can be stored as a magnetic field. A switching control signal is delivered to the gate contact (G) of the first MOSFET 20 in order to repeatedly switch the first MOSFET 20 between an off-state and an on-state. In the off-state of the first MOSFET 20, a positive potential across the first diode 22 due to a charge on the boost inductor 30 allows current from the boost inductor (I_BOOST) to flow to the first load output 36 and charge the output capacitor 32. While not shown, a load will be coupled between the first load output 36 and the second load output 38 to complete the circuit. In the on-state of the first MOSFET 20, the anode of the first diode 22 is shorted to ground, and a charge on the output capacitor 32 causes the first diode 22 to remain in a blocking mode of operation. Energy stored in the output capacitor 32 causes a current to continue to flow into the load (not shown).

Notably, the speed at which the first MOSFET 20 is able to transition between the off-state and the on-state determines many operational characteristics of the boost converter circuitry 28. Faster switching speeds allow the boost converter circuitry 28 to operate in a continuous conduction mode in which the current supplied by the boost inductor 30 in a single switching period is reduced. Generally, silicon devices cannot achieve speeds sufficient to operate in a continuous conduction mode, and instead must operate in a discontinuous conduction mode. The reduced current supply requirements afforded by switching the first MOSFET 20 at high speeds results in a reduced requirement for energy storage by the boost inductor 30, and reduced electromagnetic interference (EMI), which eases the design of electromagnetic filtering circuitry associated with the boost converter circuitry 28. Accordingly, the inductance of the boost converter can be reduced without affecting the performance of the boost converter circuitry 28. Generally, the inductance value of an inductor is proportional to the size thereof. Accordingly, the size of the boost inductor 30 can be reduced as well. Further, the inductance value and size of an inductor is proportional to the cost thereof. As the boost inductor 30 may be among the most expensive parts of the boost converter circuitry 28, it may be highly beneficial to utilize the high switching speed of the first MOSFET 20 in order to reduce these costs. In one embodiment, the inductance value of the boost inductor 30 may be less than 450 µH due to the switching speeds achievable by the first MOSFET 20 as discussed herein. For example, the inductance of the boost inductor 30 may be between 25 µH and 150 µH, may be between 150 µH and 300 µH, and may be between 300 µH and 450 µH. Further, the total volume of the boost inductor 30 may be less than 7 cubic inches (e.g., between 1 cubic inch and 3 cubic inches, between 3 cubic inches and 5 cubic inches, and between 5 cubic inches and 7 cubic inches) and the total weight of the boost inductor 30 may be less than 1 pound (e.g., between 0.1 pounds and 0.3 pounds, between 0.3 pounds and 0.6 pounds, and between 0.6 pounds and 0.9 pounds) in some embodiments.

Figure 5:
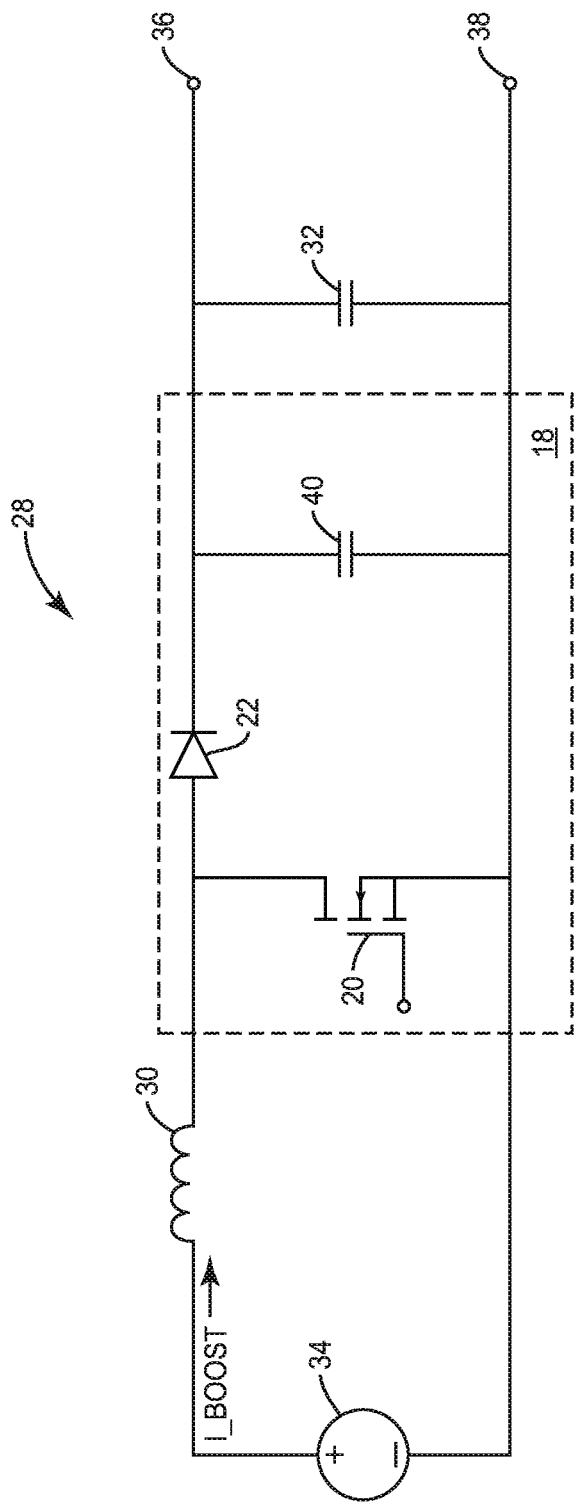
FIG. 5 is a schematic of a boost converter including power converter circuitry according to an additional embodiment of the present disclosure.

FIG. 5 shows the boost converter circuitry 28 according to an alternative embodiment of the present disclosure. The boost converter circuitry 28 shown in FIG. 5 is substantially similar to that shown in FIG. 4, except that the boost converter circuitry 28 shown in FIG. 5 includes an inner-loop capacitor 40 coupled between the first load output 36 and the second load output 38 (in parallel with the output capacitor 32). Notably, the inner-loop capacitor 40 is within the power converter circuitry 18 itself. Specifically, the inner-loop capacitor 40 closes the loop between the cathode of the first diode 22 and the source contact (S) of the first MOSFET 20 in as short a length as possible. This improves performance of the power converter circuitry 18 by reducing parasitic inductances and thus reducing ringing and other performance-reducing phenomena. In the embodiment shown in FIG. 5, the inner-loop capacitor 40 may be a high-frequency capacitor such as a ceramic capacitor, while the output capacitor 32 may be a relatively low-frequency capacitor such as an electrolytic capacitor or polymer film capacitor. However, the output capacitor 32 and the inner-loop capacitor 40 may be any type of capacitor without departing from the principles described herein.

Figure 6:
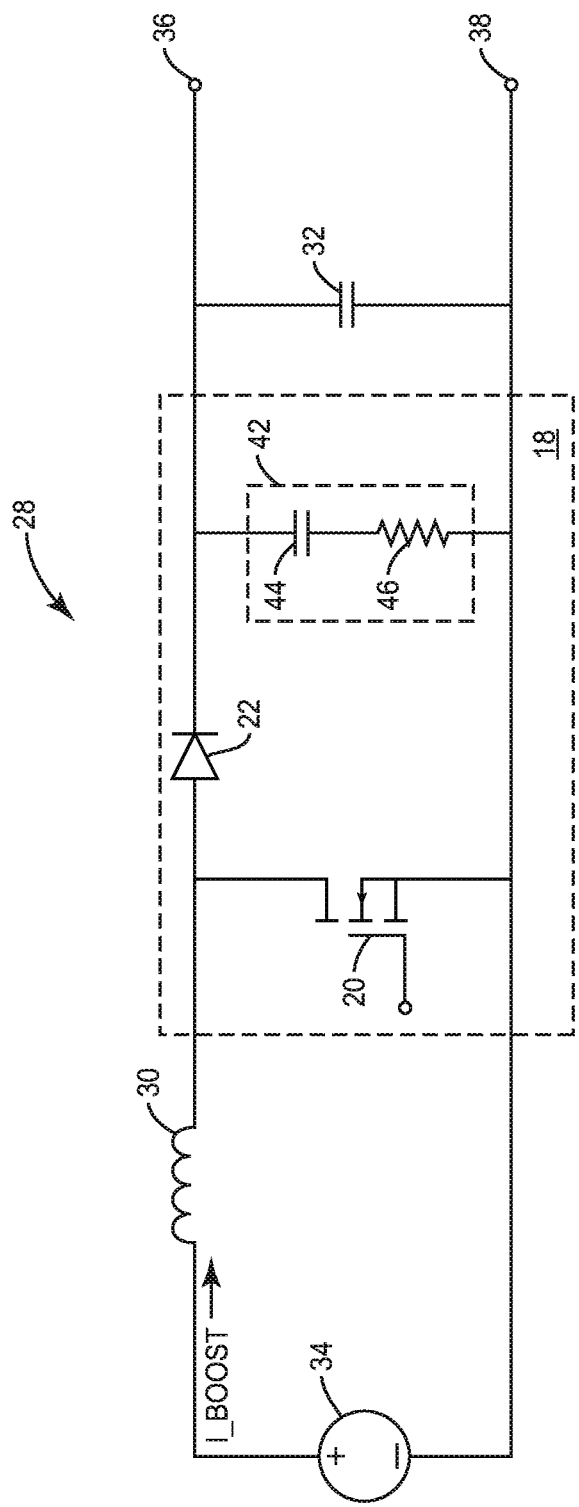
FIG. 6 is a schematic of a boost converter including power converter circuitry according to an additional embodiment of the present disclosure.

FIG. 6 shows the boost converter circuitry 28 according to an additional embodiment of the present disclosure. The boost converter circuitry shown in FIG. 6 is substantially similar to that shown in FIG. 4, except that the boost converter circuitry 28 shown in FIG. 6 includes snubber circuitry 42 coupled between the first load output 36 and the second load output 38. The snubber circuitry 42 includes a snubber capacitor 44 and a snubber resistor 46 coupled in series between the first load output 36 and the second load output 38. As discussed above, the snubber capacitor 44 and the snubber resistor 46 may be within the power converter circuitry 18 in order to reduce the length of the snubber loop between the cathode of the first diode 22 and the source contact (S) of the first MOSFET 20. The snubber circuitry 42 effectively reduces transient signals, occurring at the cathode of the first diode 22. Specifically, ringing occurring due to swings in the current provided at the cathode of the first diode 22 may be significantly reduced by the snubber circuitry 42. Reducing this ringing prevents output overshoots and undershoots, thus increasing the reliability and performance of the boost converter circuitry 28 primarily by lowering radiated and conducted EMI.

Figure 7:
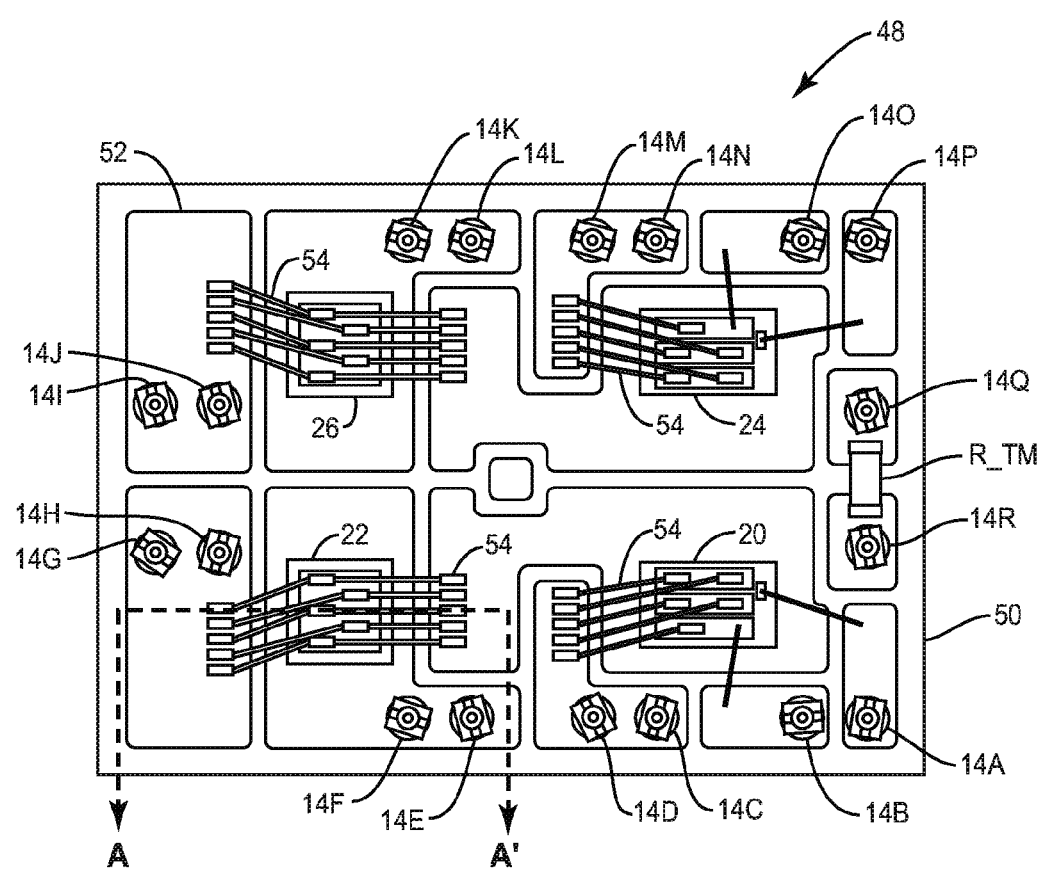
FIG. 7 is a top view of power converter circuitry according to one embodiment of the present disclosure.

FIG. 7 shows a top view of a substrate 48 within the housing 12 according to one embodiment of the present disclosure. Notably, the substrate 48 may be an active metal braze (AMB) substrate including an insulating aluminum nitride base layer 50 and a first conductive layer 52 on a first surface of the aluminum nitride base layer 50. As discussed herein, an active metal braze (AMB) substrate is a substrate in which conductive layers applied to a base layer have been brazed in a high temperature vacuum brazing process in order to form a strong bond between the conductive layers and the insulating base layer. In general, AMB substrates are stronger than their conventional counterparts formed from technologies such as direct bond copper (DBC) and the like. Using an AMB substrate provides the necessary strength to the aluminum nitride base layer 50 to make it viable for use in the power converter module 10, which in some embodiments does not include a baseplate, to increase the structural integrity thereof as in conventional designs. Aluminum nitride generally has far superior thermal conduction properties when compared to conventional substrate materials such as aluminum oxide. The increased thermal conductivity afforded by the use of the aluminum nitride base layer 50 allows for the switching components in the power converter module 10 to operate at lower temperatures, which may translate into higher power levels, higher efficiency, higher reliability, or all three. In some embodiments, the increased thermal conductivity afforded by the use of the aluminum nitride base layer 50 may allow for a reduction in the size of the switching components in the power converter module 10 while maintaining the same power rating or an increase in the power rating of the power converter module 10 without any change in the size of the switching components. Reducing the size of the switching components in the power converter module 10 may provide significant cost savings that more than account for the added cost of the aluminum nitride base layer 50, thereby reducing the price of the power converter module 10. Increasing the power rating of the power converter module 10 without changing the size of the switching components therein reduces the cost performance (e.g., dollars per Amp) of the power converter module 10.

In other embodiments, the substrate 48 is an active metal braze (AMB) substrate including an insulating silicon nitride base layer 50 and a first conductive layer 52 on a first surface of the silicon nitride base layer 50. Silicon nitride may have similar properties to aluminum nitride as discussed above and therefore may increase the performance of the power converter module 10. In another embodiment, the substrate 48 may be a DBC substrate including an aluminum nitride or silicon nitride base layer, which may allow for similar performance improvements to those discussed above.

The first conductive layer 52 is etched to form a desired pattern on the first surface of the aluminum nitride base layer 50. Wirebonds 54 connect the first MOSFET 20, the first diode 22, the second MOSFET 24, and the second diode 26 to various parts of the first conductive layer 52 in order to connect the various components as described above with respect to FIG. 3. The particular pattern of the first conductive layer 52 is chosen in order to minimize the distance from the gate contact (G) of each one of the first MOSFET 20 and the second MOSFET 24 to their respective I/O pins 14, minimize the length of the wirebonds 54, and optimize current flow through the power converter module 10. In one embodiment, the pattern of the first conductive layer 52 and routing of wirebonds 54 are designed such that the power switching path has a maximum length of about 50 mm and the gate control path has a maximum length of about 20 mm. As defined herein, the gate control path is the total distance (as determined by tracing the path) between I/O pin 14O (shown in FIG. 3) and I/O pin 14P (also shown in FIG. 3). Further as defined herein, the power switching path is the total distance (as determined by tracing the path) between I/O pin 14E and I/O pin 14F to I/O pin 14C and I/O pin 14D (all shown in FIG. 3). Minimizing the power switching path length and gate control path length reduces the stray inductance in the power converter module 10, which may be less than 15 nH according to some embodiments. In one embodiment, wirebonds 54 in the gate control path have a diameter of ~5 mil, while wirebonds 54 in the power switching path have a diameter ~15 mil. More or less wirebonds 54 may be used to form a particular leg of the particular conduction path based on a desired current carrying capacity thereof.

Figure 8:
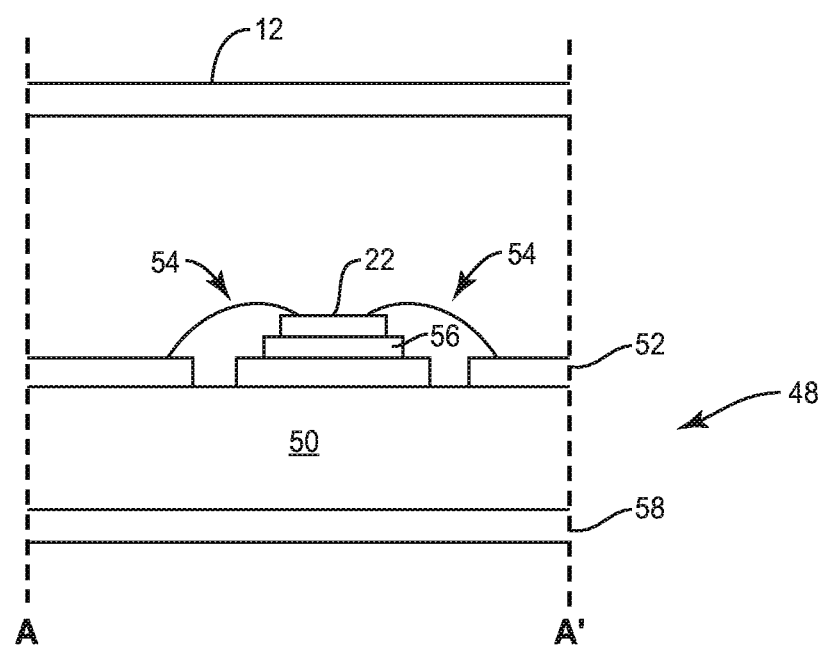
FIG. 8 is a cross-sectional view of a substrate and the power converter circuitry shown in FIG. 3 according to one embodiment of the present disclosure.

FIG. 8 shows a cross-sectional view of the housing 12 and the substrate 48 through line A-A' shown in FIG. 7. As shown in FIG. 8, the substrate 48 is mounted in the housing 12 and includes the aluminum nitride base layer 50, the first conductive layer 52 on which the first diode 22 is attached via a die attach material 56 and connected via the wirebonds 54, and a second conductive layer 58. In some embodiments, the space between the substrate 48 and the housing 12 is filled with an inert gel. Notably, as discussed above, the power converter module 10 does not include a baseplate in some embodiments. Accordingly, the substrate 48 must be adequately rugged in order to support the power converter circuitry 18 formed on the first conductive layer 52. Further, as silicon carbide devices are generally high power density devices that produce a significant amount of heat, it is desirable for the substrate 48 to have a relatively low thermal resistance such that the substrate 48 is capable of efficiently dissipating heat. Using an AMB substrate as discussed above provides a strong substrate 48 that is capable of efficiently dissipating heat. In one embodiment, the insulating base layer 50 may have a minimum thermal conductivity of 30 W/m-K in order to provide low thermal resistance between the power converter circuitry 18 and the second conductive layer 58. Accordingly, the power converter circuitry 18 may be operated in order to provide additional power output, additional efficiency, or both.

Figure 9:
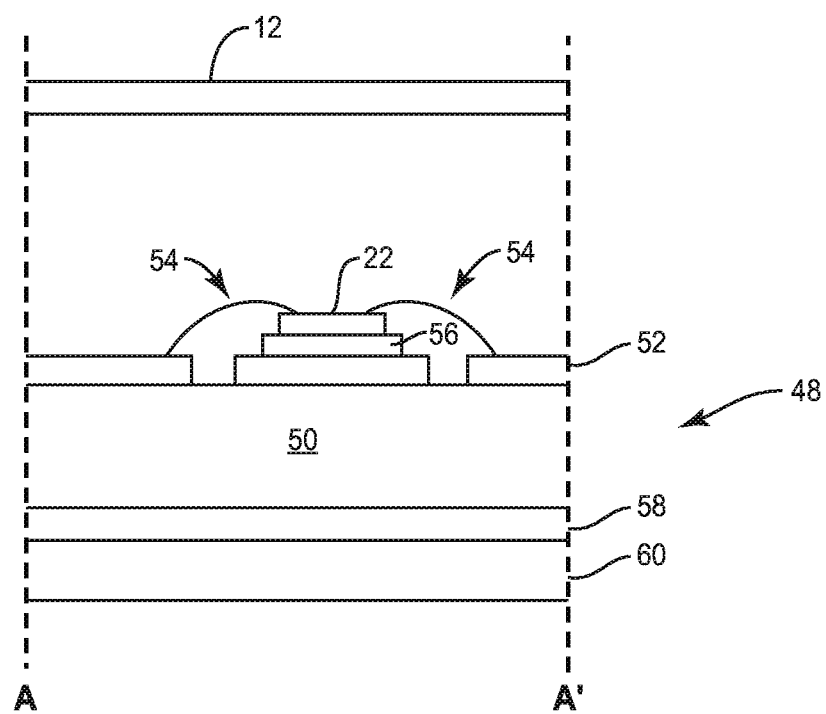
FIG. 9 is a cross-sectional view of a substrate and the power converter circuitry shown in FIG. 3 according to one embodiment of the present disclosure.

While the power converter module 10 may not include a baseplate in some embodiments, a baseplate may be added to the power converter module 10 to increase the performance thereof and/or decrease the cost thereof. Accordingly, FIG. 9 shows a cross-sectional view of the housing 12 and the substrate 48 through line A-A' shown in FIG. 7. The cross-section shown in FIG. 9 is substantially similar to that shown in FIG. 8 but further includes a baseplate 60 below the second conductive layer 58. As discussed above, when following conventional design principles for either silicon or silicon carbide-based power converter modules, a baseplate has not been included whenever it is not strictly necessary for structural support due the fact that the baseplate increases the cost of the module. Accordingly, power converter modules below a certain size such as those discussed herein have not included a baseplate, and are well known in the industry as "baseplate-less" power converter modules. Specifically, conventional design principles generally do not include a baseplate on any power module with a footprint less than 30 cm$^2$, less than 25 cm$^2$, less than 20 cm$^2$, less than 15 cm$^2$, or less than 10 cm$^2$ due to the cost associated therewith. As discussed herein, the "footprint" of a power converter module is the area (e.g., length×width) of a surface covered thereby when the power converter module is installed. Contrary to these well-established design principles, the inventors of the subject matter of the present disclosure discovered that by adding the baseplate 60 to the power converter module 10, the size of the silicon carbide switching components in the power converter module 10 may be reduced while maintaining the same power rating or the power rating of the power converter module 10 may be increased without increasing the size of the switching components. In some embodiments, the size of the switching components may be reduced up to 40% while maintaining the same power rating and/or the power rating of the power converter module 10 may be increased up to 40% without increasing the size of the switching components. Generally, the cost reduction from reducing the size of the switching components in the power converter module 10 and/or increasing the power rating of the power converter module 10 without increasing the size of the switching components more than compensates for the added cost associated with the addition of the baseplate 60.

In one exemplary embodiment, a power converter module 10 may provide an output current (rated) of 40 Amps and an output power (rated) of 30 kW using switching components with an active area less than 30 mm$^2$. In another embodiment, a power converter module 10, which includes a baseplate 60, may provide an output current (rated) of 60 Amps and an output power (rated) of 45 kW using switching components with an active area less than 30 mm$^2$.

The baseplate 60 may be formed of any suitable material without departing from the principles of the present disclosure. For example, the baseplate 60 may be copper, which provides excellent thermal conductivity and thus may significantly increase the thermal performance of the power converter module.

Figure 10A:
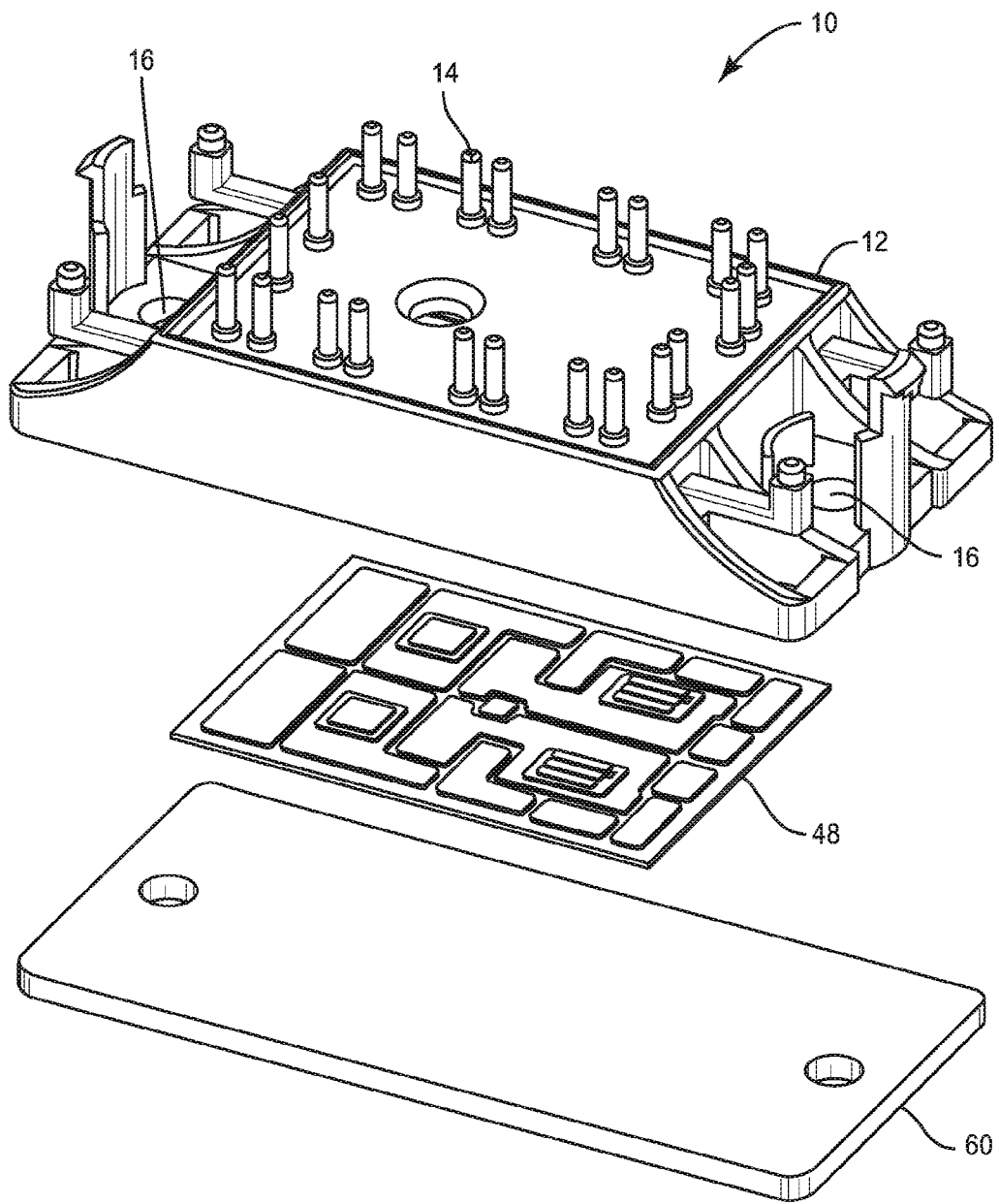
FIGS. 10A and 10B illustrate a power converter module including a baseplate according to one embodiment of the present disclosure.
Figure 10B:
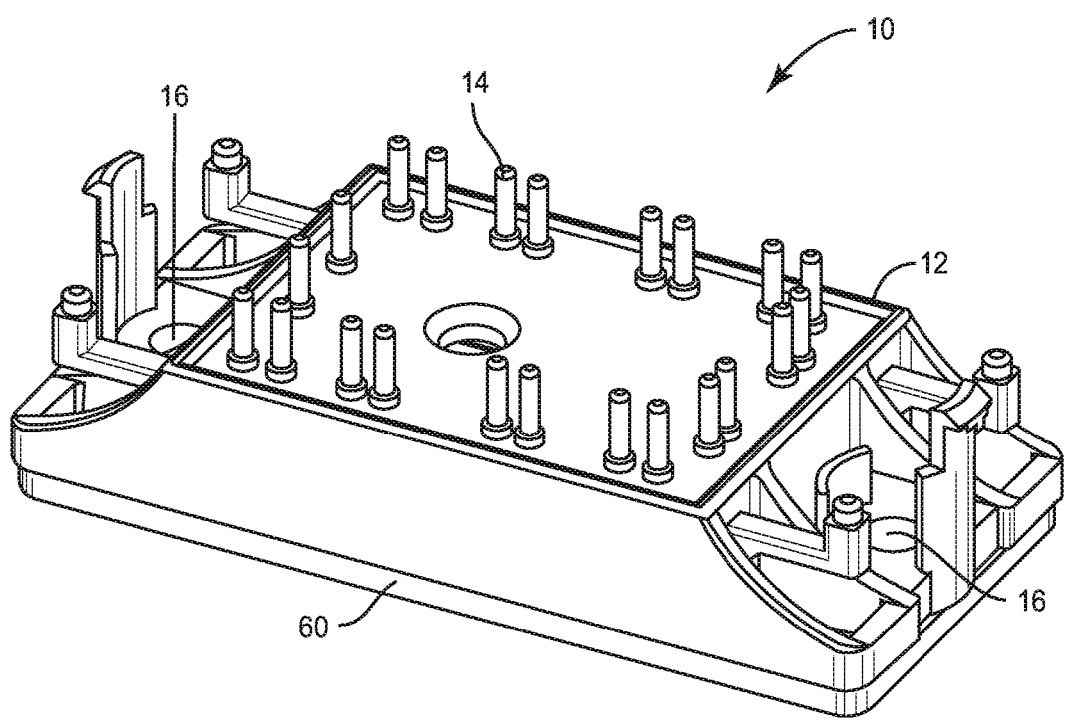

FIGS. 10A and 10B show an isometric view of the power converter module 10 including the baseplate 60 and an exploded isometric view of the power converter module 10 including the baseplate 60. As shown therein, the substrate 48 is provided on the baseplate 60, and the housing 12 is provided over the substrate 48 and the baseplate 60. When installing the power converter module 10 into a system for use, the baseplate 60 may be mounted on a heat dissipating surface such as a heatsink, one or more connectors may be provided through the mounting holes 16 to secure the power converter module 10, and connections may be made to various I/O pins 14 of the power module 10 to connect the module as desired.

Figure 11:
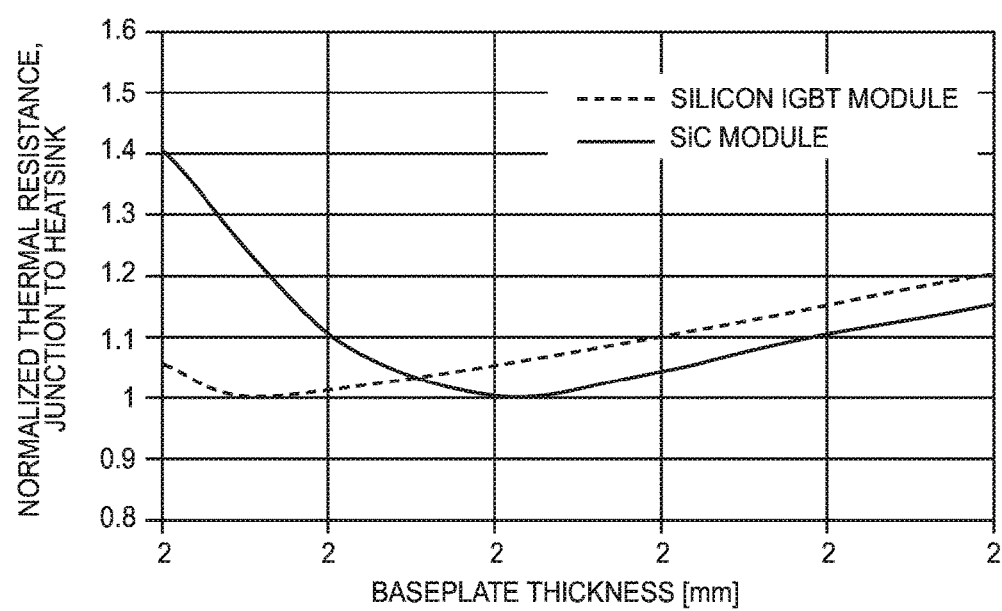
FIG. 11 is a graph illustrating the normalized thermal resistance vs. baseplate thickness for conventional silicon-based power converter modules and a power convert module according to one embodiment of the present disclosure.

FIG. 11 is a graph comparing normalized thermal resistance (measured from a junction of an active device in a power converter module to a heatsink to which the module is attached) to a baseplate thickness of the module. A dashed line illustrates the normalized thermal resistance vs. baseplate thickness for a conventional silicon-based power converter module to a heatsink to which the module is attached. As shown, there is little improvement in junction-to-heatsink normalized thermal resistance gained by adding a baseplate of any thickness to such a conventional silicon-based power converter module, since the ratio of net die area to module footprint area is relatively large as discussed above. The large size of the silicon devices in such a module makes them relatively proficient at dissipating heat generated during operation, and a baseplate therefore provides only a nominal improvement in thermal resistance. As discussed above, the low cost of silicon compared to the cost of copper thus has led to design principles that discard additional thermal management components such as the baseplate whenever possible.

A solid line illustrates the normalized thermal resistance vs. baseplate thickness for the power converter module 10 discussed herein. As shown, there is a significant improvement in normalized thermal resistance due to the addition of a baseplate. As the baseplate thickness increases up to 2 mm, the normalized thermal resistance reduces up to 40%. At some point, the thermal resistance begins to increase due to bulk thermal conductivity of the baseplate material itself. The relatively large improvement in normalized thermal resistance attributed to the baseplate is due to the small size and thus high heat flux density of silicon carbide switching components, which are used in the power converter module 10. These components are less adept at dissipating heat on their own, and thus adding thermal management components such as the baseplate 60 may significantly increase the performance thereof such that the size of the switching elements may be reduced and/or the power rating of the power converter module 10 increased as discussed above. Due to the conventional design processes associated with both conventional silicon power converter modules and silicon carbide power converter modules discussed above, the curve shown in FIG. 10 has been ignored. In other words, conventional design processes have favored removal of the baseplate over the thermal resistance improvements afforded thereby in order to save cost. However, the inventors discovered that by adding thermal components, which have previously been thought to increase the overall cost of a power converter module, the cost of the silicon carbide switching devices in the module may actually be significantly reduced, more than compensating for the cost of the additional thermal management components.

Figure 12:
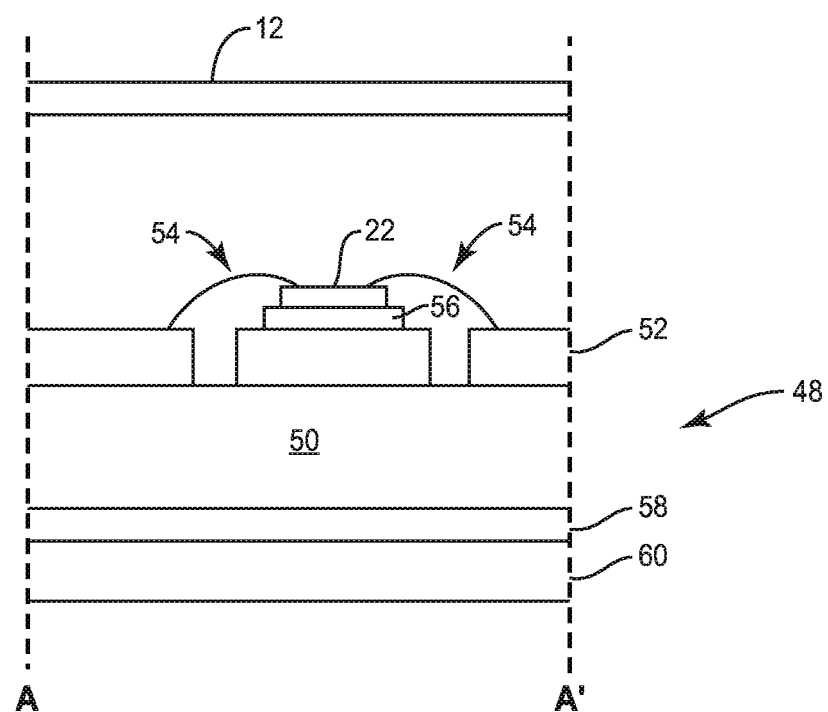
FIG. 12 is a cross-sectional view of a substrate and the power converter circuitry shown in FIG. 3 according to one embodiment of the present disclosure.

In some embodiments, a thickness of the first conductive layer 52 may be increased such that the first conductive layer 52 functions as both a heat spreading element and a conductive path for signals in the power converter module 10. Accordingly, FIG. 12 shows a cross-sectional view of the housing 12 and the substrate 48 through line A-A' shown in FIG. 7. The baseplate 60 is also shown, although it may optionally be removed in such an embodiment. The cross-section shown in FIG. 12 is substantially similar to that shown in FIG. 9 except that the thickness of the first conductive layer 52 is significantly increased. As discussed above, the primary function of the first conductive layer 52 is to form electrical connections between various components in the power converter module 10. Accordingly, the first conductive layer 52 is patterned as desired in order to form these connections. To further improve thermal performance, the thickness of the first conductive layer 52 may be increased such that it functions both as a current carrying layer and a thermal dissipation layer, as shown in FIG. 10. By providing the first conductive layer 52 in this manner, the size of the switching components in the power converter module 10 may be further reduced, which may increase the performance of the power converter module 10 and/or reduce the cost thereof. While increasing the thickness of the first conductive layer 10 may result in additional cost, the reduction in size of the switching components in the power converter module 10 may more than compensate for these costs, thereby resulting in a net reduction in the cost of the module. The thickness of the first conductive layer 52 may be chosen depending on the performance requirements of the power converter module 10, and in particular the resistance of the conductive traces provided by the first conductive layer 52 and the thermal performance of the layer. In various embodiments, a thickness of the first conductive layer 52 may be between 0.5 mm and 2.0 mm to accomplish the above objectives, and specifically may be 0.5 mm, 0.75 mm, 1.0 mm, 1.25 mm, 1.5 mm, 1.75 mm, and 2.0 mm in various embodiments.

Those skilled in the art will recognize improvements and modifications to the preferred embodiments of the present disclosure. All such improvements and modifications are considered within the scope of the concepts disclosed herein and the claims that follow.

What is claimed is:

1. A power converter module comprising:
   a baseplate;
   a substrate on the baseplate;
   one or more silicon carbide switching components on the substrate; and
   a housing over the baseplate, the substrate, and the one or more silicon carbide switching components, the housing having a footprint less than 25 $cm^2$.

2. The power converter module of claim 1 wherein the housing has a footprint greater than 5 $cm^2$.

3. The power converter module of claim 1 wherein the substrate comprises:
   a base layer of aluminum nitride;
   a first conductive layer on a first surface of the aluminum nitride base layer; and
   a second conductive layer on a second surface of the aluminum nitride base layer opposite the first layer.

4. The power converter module of claim 3 wherein the baseplate comprises copper.

5. The power converter module of claim 3 wherein the one or more silicon carbide switching components are on the first conductive layer and the second conductive layer is on the baseplate.

6. The power converter module of claim 5 wherein the baseplate comprises copper.

7. The power converter module of claim 5 wherein the first conductive layer is etched to form a desired connection pattern between the one or more silicon carbide switching components.

8. The power converter module of claim 7 wherein the one or more silicon carbide switching components are coupled to the first conductive layer via one or more wirebonds.

9. The power converter module of claim 7 wherein the one or more wirebonds are routed such that a power switching path has a maximum length of about 50 mm and a gate control path has a maximum length of about 20 mm.

10. The power converter module of claim 1 wherein the power converter module is a boost converter configured to receive a direct current (DC) input voltage and provide a stepped-up DC output voltage.

11. The power converter module of claim 10 wherein the one or more silicon carbide switching components comprise a metal-oxide-semiconductor field-effect transistor (MOSFET) coupled in series with a Schottky diode.

12. The power converter module of claim 11 wherein:
   the MOSFET comprises a drain contact, a gate contact, and a source contact;
   the Schottky diode comprises an anode coupled to the drain contact of the MOSFET and a cathode; and
   the power converter module further comprises snubber circuitry coupled between the cathode of the Schottky diode and the source contact of the MOSFET.

13. The power converter module of claim 11 wherein:
the MOSFET comprises a drain contact, a gate contact, and a source contact;
the Schottky diode comprises an anode coupled to the drain contact of the MOSFET and a cathode; and
the power converter module further comprises an inner-loop capacitor provided on the substrate and coupled between the cathode of the Schottky diode and the source contact of the MOSFET.

14. The power converter module of claim 1 wherein the power converter module is configured to provide an output current up to 60 Amps, an output power up to 45 kW, and an active area of each of the one or more silicon carbide switching components is less than 30 mm$^2$.

15. The power converter module of claim 1 wherein the power converter module is configured to provide an output current up to 40 Amps, an output power up to 30 kW, and an active area of each of the one or more silicon carbide switching components is less than 30 mm$^2$.

16. The power converter module of claim 1 wherein the one or more silicon carbide switching components provide one of a buck converter, a half-bridge converter, a full-bridge converter, and a three-phase converter.

17. A power converter module comprising:
a baseplate;
a substrate on the baseplate;
one or more silicon carbide switching components on the substrate, the one or more silicon carbide switching components occupying an active area less than 30 mm$^2$ per switching component; and
a housing over the baseplate, the substrate, and the one or more silicon carbide switching components.

18. The power converter module of claim 17 wherein the substrate comprises:
a base layer of aluminum nitride;
a first conductive layer on a first surface of the aluminum nitride base layer; and
a second conductive layer on a second surface of the aluminum nitride base layer opposite the first layer.

19. The power converter module of claim 18 wherein the one or more silicon carbide switching components are on the first conductive layer and the second conductive layer is on the baseplate.

20. A power converter module comprising:
a substrate comprising a base layer, a first conductive layer on a first surface of the base layer, and a second conductive layer on a second surface of the base layer opposite the first surface, wherein a thickness of the first conductive layer is greater than 0.5 mm;
one or more silicon carbide switching components on the first conductive layer of the substrate; and
a housing over the substrate and the one or more silicon carbide switching components.

21. The power converter module of claim 20 wherein the thickness of the first conductive layer is less than 2.0 mm.

* * * * *

UNITED STATES PATENT AND TRADEMARK OFFICE
CERTIFICATE OF CORRECTION

PATENT NO. : 10,224,810 B2  
APPLICATION NO. : 15/295599  
DATED : March 5, 2019  
INVENTOR(S) : Adam Barkley and Marcelo Schupbach Page 1 of 1

It is certified that error appears in the above-identified patent and that said Letters Patent is hereby corrected as shown below:

In the Specification

In Column 4, Lines 34-39, replace:
"It will also be understood that when an element is referred to as being "connected" or "coupled" to another element, it can be directly connected or coupled to the other is referred to as being "directly connected" or "directly coupled" to another element, there are no intervening elements present."
With:
--It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.--.

In Column 7, Lines 34-36, replace:
"Accordingly, the first boost converter scale high-power DC voltages, which may be especially useful in applications such as solar power systems."
With:
--Accordingly, the first boost converter circuitry and the second boost converter circuitry may be used to appropriately scale high-power DC voltages, which may be especially useful in applications such as solar power systems.--.

Signed and Sealed this  
Sixteenth Day of April, 2019

Andrei Iancu  
*Director of the United States Patent and Trademark Office*